United States Patent [19]
Yamazaki

[11] Patent Number: 5,686,991
[45] Date of Patent: Nov. 11, 1997

[54] POSITIONING APPARATUS HAVING THE INTERFEROMETER AND ACCELEROMETER POSITIONED SUCH THAT THERE SIGNALS ARE IN PHASE

[75] Inventor: Toshiaki Yamazaki, Utsunomiya, Japan

[73] Assignee: Canon Kabushiki Kaisha, Tokyo, Japan

[21] Appl. No.: 630,593

[22] Filed: Apr. 10, 1996

[30] Foreign Application Priority Data

Apr. 20, 1995 [JP] Japan .................................. 7-117614

[51] Int. Cl.$^6$ .................................................. G01B 9/02
[52] U.S. Cl. ................................. 356/358; 356/399
[58] Field of Search .............................. 356/358, 363, 356/399, 400

[56] References Cited

U.S. PATENT DOCUMENTS 4,659,225   4/1987   Takahashi ........................ 356/358
5,151,749   9/1992   Tanimoto et al. ................ 356/363

*Primary Examiner*—Samuel A. Turner
*Attorney, Agent, or Firm*—Fitzpatrick, Cella, Harper & Scinto

[57] ABSTRACT

A positioning apparatus includes a stationary portion, a movable portion, a position measuring device, an accelerometer, and a controller. The movable portion is movably mounted on the stationary portion. The acceleration of the movable portion causes vibration of the stationary portion. The position measuring device is fixed to the stationary portion, measures the position of the movable portion, and produces a position signal representative thereof and representative of the position of the stationary portion with respect to the movable portion when the stationary portion is vibrating. The accelerometer is fixed to the stationary portion and measures the acceleration of the stationary portion and produces an acceleration signal representative thereof. The controller feeds back measured values of the position measuring device and the accelerometer to the movable portion to move and position the movable portion to a predetermined target position. The position measuring device and the accelerometer are positioned on the stationary portion such that the position signal is in phase with the acceleration signal.

14 Claims, 5 Drawing Sheets

| FIG. 6A | FIG. 6B |

POSITIONING APPARATUS HAVING THE INTERFEROMETER AND ACCELEROMETER POSITIONED SUCH THAT THERE SIGNALS ARE IN PHASE

BACKGROUND OF THE INVENTION

1. Field of the Invention

The present invention relates to a positioning apparatus which is used in, for example, a semiconductor exposure system and which performs positioning control with a controller at a high speed and with high accuracy.

2. Description of the Related Art

FIGS. 6A and 6B illustrate a positioning apparatus of X-, Y-stages of a conventional semiconductor exposure system. The positioning apparatus shown in FIG. 6 consists of the following components: a mount 1 for dissipating vibrations of surface plates of the apparatus due to a reactive force created when X-, Y-stages are driven in a step-by-step manner (hereinafter, called a step-drive) and for reducing the influence of floor vibration; a base surface plate 2 and a telescopic surface plate 3 supported by the mount 1; a stage surface plate 4 disposed on the base surface plate 2 and having a reference surface on the upper surface thereof; a Y-stage 5 which is disposed on the stage surface plate 4 and is movable in the Y direction; an X-stage 6 which is disposed on the Y-stage and is movable in the X direction; a top plate 7 disposed on the X-stage; an X-stage position measuring mirror (not shown) disposed on the top plate 7; a Y-stage position measuring mirror 8 disposed on the top plate 7; an X-stage position measuring laser interferometer (not shown) fixed to the telescopic surface plate 3; a Y-stage position measuring laser interferometer 9 fixed to the telescopic surface plate 3; an X-direction surface plate accelerometer (not shown) disposed on the base surface plate 2 to detect the acceleration of the base surface plate 2 in the X direction by taking a negative direction of the X-stage as a positive direction of the acceleration of the base surface plate 2; a Y-direction surface plate accelerometer 10 disposed on the base surface plate 2 to detect the acceleration of the base surface plate 2 in the Y direction by taking a negative direction of the Y-stage 5 as a positive direction of the acceleration of the base surface plate 2; a console 11 for setting target positions of the X-, Y-stages 5 and 6; an X-stage controller 12 receiving a signal representing a step-drive target position of the X-stage output from the console 11, a signal representing the X-stage position information output from the X-stage laser interferometer (not shown), and an acceleration signal of the base surface plate 2 in the X direction output from the X-direction surface plate accelerometer (not shown), and which outputs a motor-driving-current command signal for the X-stage 6; a Y-stage controller 13 receiving a signal representing a step-drive target position of the Y-stage 5 output from the console 11, a signal representing the Y-stage position information output from the Y-stage laser interferometer 9, and an acceleration signal of the base surface plate 2 in the Y direction output from the Y-direction surface plate accelerometer 10, and which outputs a motor-driving-current command signal for the Y-stage 5; an X-stage driver 14 to which the motor-driving-current command signal for the X-stage 6 is input and which supplies a driving current of an actuator for the X-stage 6; and a Y-stage driver 15 to which the motor-driving-current command signal for the Y-stage 5 is input and which supplies a driving current of an actuator for the Y-stage 5. Thus, the movable portion of the apparatus has two movable parts, Y-stage 5 and X-stage 6, movable at right angles to each other, and the position measurement devices (the X and Y-stage position measuring laser interferometers) and the position controllers (the X-stage controller 12 and the Y-stage controller 13) perform measuring and positioning for each stage separately and independently. In addition, the X-direction and Y-direction surface plate accelerometers are disposed on a flat surface of the base surface plate 2 parallel to the moving direction of the Y-stage 5 and the X-stage 6.

When the Y-stage 5 is step-driven, acceleration is generated when the Y-stage 5 decelerates and stops, and as a reaction thereof, a reactive force is transmitted through the stage surface plate 4 to the base surface plate 2 and the telescopic surface plate 3. However, the Y-stage 5 tends to stay at its original position due to inertia regardless of the base surface plate 2 and the telescopic surface plate 3, and vibrates at a low frequency by the reactive force of the base surface plate 2 and the telescopic surface plate 3. As a result, a positional shift occurs between the Y-stage 5 and the base surface plate 2 and telescopic surface plate 3. Then, acceleration due to the reactive force is detected by the Y-direction surface plate accelerometer 10 disposed on the base surface plate 2. The acceleration signal thus detected is input to the Y-stage controller 13 to allow the same acceleration as that of the base surface plate 2 to act on the Y-stage 5 in real time, whereby the Y-stage 5 is caused to follow the vibrations of the base surface plate 2 and telescopic surface plate 3 to eliminate the positional shift so that the Y-stage 5 is properly positioned.

Similarly, when the X-stage 6 is step-driven, acceleration is generated when the X-stage decelerates and stops, and as a reaction thereof, a reactive force is transmitted through the Y-stage 5 and the stage surface plate 4 to the base surface plate 2 and the telescopic surface plate 3. However, the X-stage 6 tends to stay at its original position due to inertia regardless of the base surface plate 2 and the telescopic surface plate 3, and vibrates at a low frequency by the reactive force of the base surface plate 2 and the telescopic surface plate 3. As a result, a positional shift occurs between the X-stage 6 and the base surface plate 2 and telescopic surface plate 3. Then, acceleration due to the reactive force is detected by the X-direction surface plate accelerometer (not shown) disposed on the base surface plate 2. The acceleration signal thus detected is input to the X-stage controller 12 to allow the same acceleration as that of the base surface plate 2 to act on the X-stage 6 in real time, whereby the X-stage 6 is caused to follow vibrations of the base surface plate 2 and telescopic surface plate 3 to eliminate the positional shift so that the X-stage 6 is properly positioned.

SUMMARY OF THE INVENTION

In the above-described apparatus, when the Y-stage 5 is step-driven to be positioned and vibrations of the base surface 2 and the telescopic surface plate 3 have only a translation component, an acceleration signal of the base surface plate 2 in the Y direction output from the Y-direction surface plate accelerometer 10 is always in phase with a signal representing position information output from the Y-stage position measuring laser interferometer 9, and no problem occurs when controlling the position of the Y-stage 5. Similarly, when the X-stage 6 is step-driven to be positioned and vibrations of the base surface 2 and the telescopic surface plate 3 have only a translation component, an acceleration signal of the base surface plate 2 in the X direction output from the X-direction surface plate accelerometer (not shown) is always in phase with a signal representing position information output from the X-stage position measuring laser interferometer (not shown), and no problem occurs when controlling the position of the X-stage 6.

However, when the vibration of the base surface plate 2 and the telescopic surface plate 3 in the Y direction due to the step-drive of the Y-stage have a rotational component (e.g., a pitch component) simultaneously in addition to the translation component, an acceleration signal of the base surface plate 2 in the Y direction output from the Y-direction surface plate accelerometer 10 and a signal representing position information output from the Y-stage position measuring laser interferometer 9 may be opposite in phase, thereby causing a deterioration in the accuracy with which the Y-stage 5 can be positioned. Similarly, when the vibration of the base surface plate 2 and the telescopic surface plate 3 in the X direction due to the step-drive of the X-stage simultaneously have a rotational component (e.g., a pitch component) in addition to the translation component, an acceleration signal of the base surface plate 2 in the X direction output from the X-direction surface plate accelerometer (not shown) and a signal representing position information output from the X-stage position measuring laser interferometer (not shown) may be opposite in phase, thereby causing deterioration in the accuracy with which the X-stage 6 can be positioned.

That is, when the vibrations of the base surface plate 2 and telescopic surface plate 3 in the Y direction have a translation component and a rotational component simultaneously, the acceleration in the Y direction due to a vibration of the base surface plate 2 at a portion of the Y-stage position measuring laser interferometer and the acceleration on the base surface plate 2 in the Y direction may be opposite in sign. In addition, when the vibrations of the base surface plate 2 and telescopic surface plate 3 in the X direction have a translation component and a rotational component simultaneously, the acceleration in the X direction due to a vibration of the base surface plate 2 at a portion of the X-stage position measuring laser interferometer and the acceleration on the base surface plate 2 in the X direction may be opposite in sign. Consequently, accurate feedback of the surface plate acceleration and positioning control deteriorates.

It is an object of the present invention to provide a positioning apparatus in which the positioning control properties of the stages are improved.

According to one aspect, the present invention which achieves these objections relates to a positioning apparatus comprising a stationary portion, a movable portion, position measurement means, acceleration measurement means, and positioning control means. The movable portion is movably mounted on the stationary portion. The acceleration of the movable portion causes vibration of the stationary portion. The position measurement means is fixed to the stationary portion, measures the position of the movable portion, and produces a position signal representative thereof and of the position of the stationary portion with respect to the movable portion when the stationary portion is vibrating. The acceleration measurement means is fixed to the stationary portion, measures the acceleration of the stationary portion, and produces an acceleration signal representative thereof. The positioning control means feeds back the position signal and the acceleration signal to the movable portion to move and position the movable portion to a predetermined target position. The position measurement means and the acceleration measurement means are positioned on the stationary portion such that the position signal is in phase with the acceleration signal.

According to another aspect, the present invention which achieves these objectives relates to a positioning apparatus comprising a stationary surface, a movable stage, a stage position measuring device, an accelerometer, a console, driving means, and a controller. The movable stage is disposed on the stationary surface, and is movable at least in one direction on the stationary surface. Acceleration of the movable stage vibrates the stationary surface. The stage position measuring device is disposed on the stationary surface, measures the position of the movable stage, and outputs a position signal representative thereof and of the vibration of the stationary surface occurring in response to the acceleration of the movable stage. The accelerometer is disposed on the stationary surface, measures the acceleration of the stationary surface, and outputs an acceleration signal representative thereof. The console sets a target position of the movable stage and outputs a target position signal representative thereof. The driving means drives the movable stage. The controller is attached to the console, the stage position measuring device, the accelerometer, and the driving means. The controller receives the target position signal from the console, the position signal from the stage position measuring device, and the acceleration signal from the accelerometer. The controller also outputs a driving signal to the driving means, instructing the driving means to drive the movable stage to the set target position and instructing the driving means to drive the movable stage in the same manner as the stationary surface in the event the stationary surface vibrates in response to acceleration of the movable stage, in accordance with the position signal and the acceleration signal. The stage position measuring device and the accelerometer are positioned such that the position signal is in phase with the acceleration signal in the event the vibration of the stationary surface has a translational component and a rotational component simultaneously.

According to the present invention, even if the vibration of a stationary portion due to a step-drive of the movable portion has a rotational component in addition to a translation component in the step-drive direction, an output signal of the position measurement means is in phase with an output signal of the acceleration measurement means, whereby the positioning properties of the movable portion will not deteriorate.

DETAILED DESCRIPTION OF THE PREFERRED EMBODIMENTS

Figure 1:
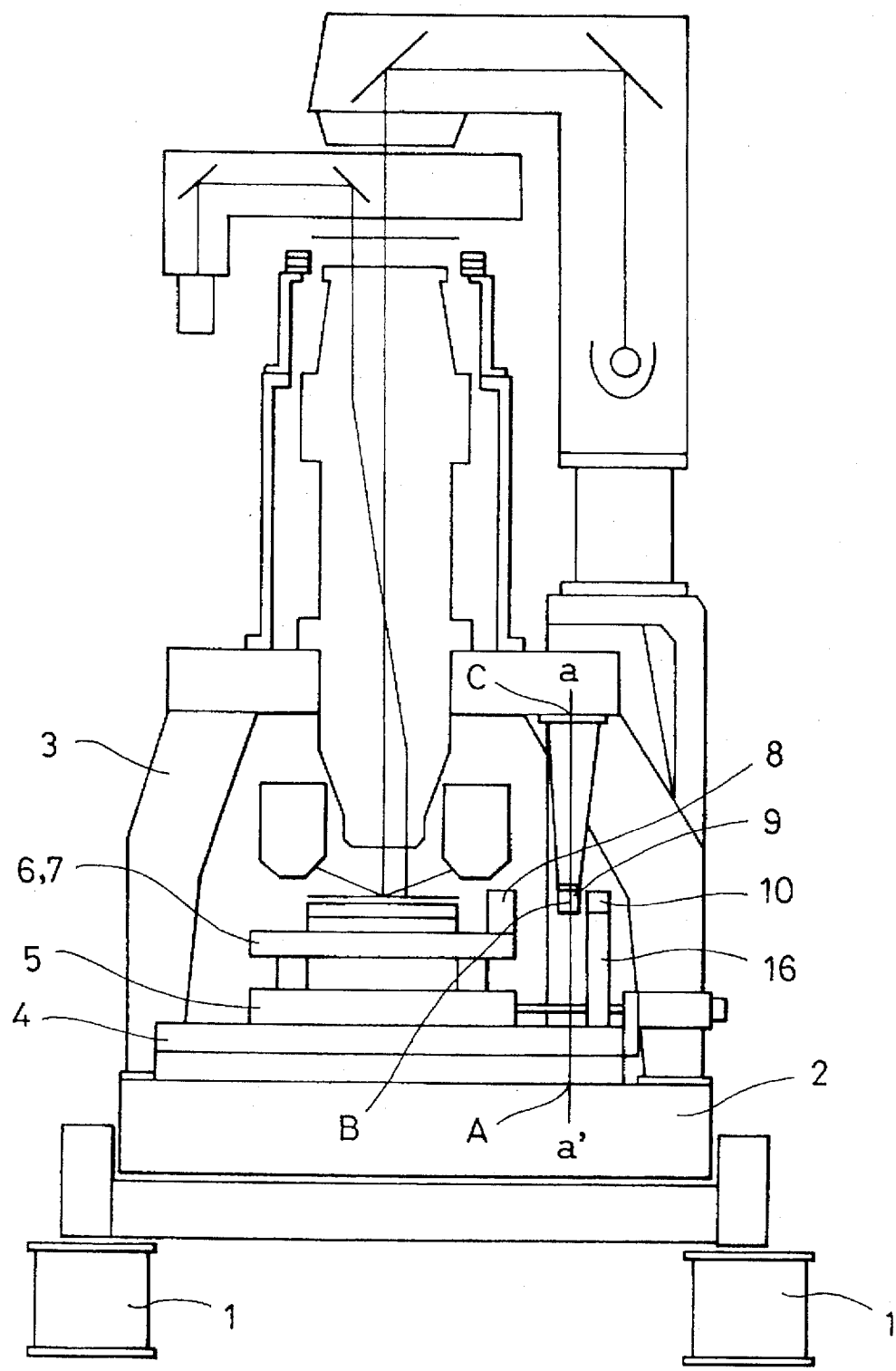
FIG. 1 illustrates a schematic view of an exposure system to which a positioning apparatus according to an embodiment of the present invention is applied.
Figures 6, 6A:
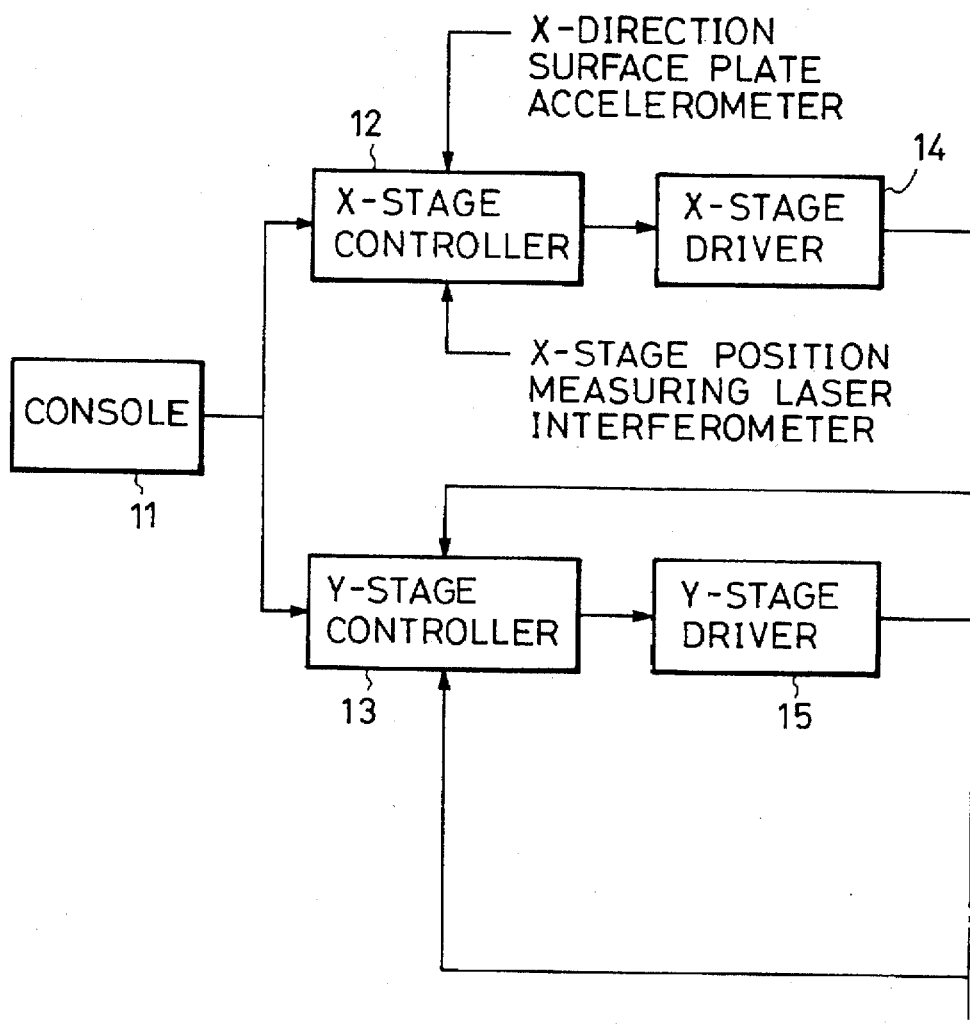
FIG. 6 is a schematic diagram illustrating the relationship between FIGS. 6A and 6B, FIG. 6A being a schematic view which illustrates a positioning apparatus of X-, Y-stages according to a conventional exposure system, and FIG. 6B being a schematic block diagram showing a control apparatus for controlling the stages.
Figure 6B:
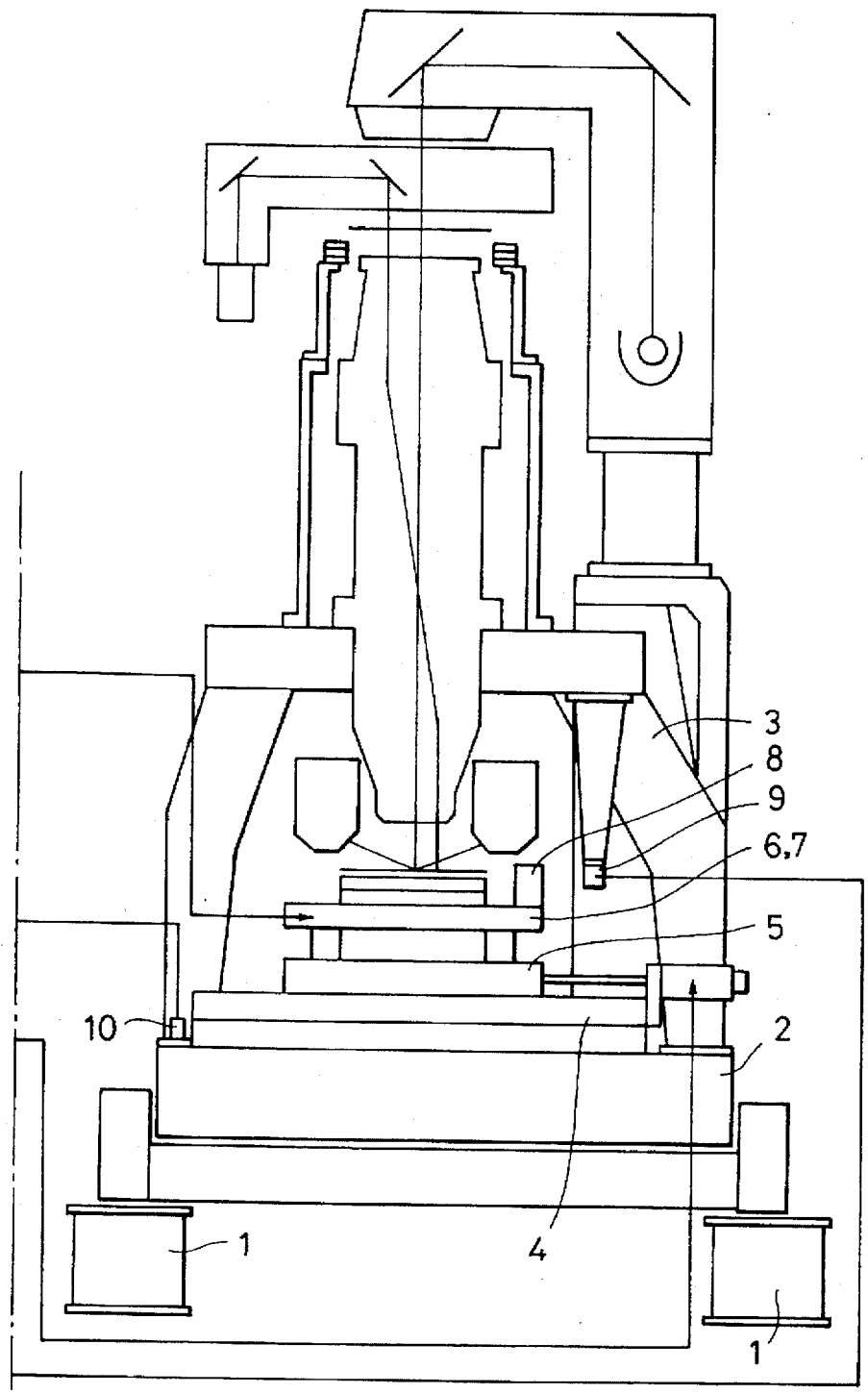

FIG. 1 illustrates an exposure system to which a positioning apparatus according to an embodiment of the present invention is applied. In FIG. 1, the same components as those of FIG. 6 are indicated by the same reference numerals. Referring to FIG. 1, there is provided a column 16 of the Y-direction surface plate accelerometer 10 for disposing the Y-direction surface plate accelerometer 10 at the height of the Y-stage position measuring laser interferometer 9.

The above-described configuration is different from the conventional one in the following ways. Conventionally, the Y-direction surface plate accelerometer 10 is disposed on the base surface plate 2 directly. In this embodiment, however, the column 16 is employed for the Y-direction surface plate accelerometer 10 so that the Y-direction surface plate accelerometer 10 can be disposed at the same height from the base surface plate 2 as the Y-stage position measuring laser interferometer 9. The upper surface of the column 16, on which the Y-direction surface plate accelerometer 10 is disposed, is flat and parallel to the moving direction of the Y-stage 5 and the X-stage 6.

Figure 2:
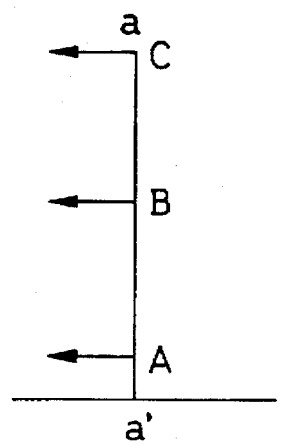
FIG. 2 illustrates a schematic view of surface plate acceleration in the Y direction of each part on the line a—a' when the surface plates of FIG. 1 move translationally in the Y direction.

The line a—a' of FIG. 1 is a straight line passing through the Y-stage position measuring laser interferometer 9 and perpendicular to the base surface plate 2. FIG. 2 illustrates the magnitude and direction of the acceleration at different parts of the line a—a' when the Y-stage 5 is step-driven, whereby the base surface plate 2 and the telescopic surface plate 3 move translationally in the step-drive direction of the Y-stage 5. The direction and length of the arrow at point A in FIG. 2 indicates the direction and magnitude of the acceleration of the surface portion of the base surface plate 2. The direction and length of the arrow at point B indicates the direction and magnitude of the acceleration of the Y-stage position measuring laser interferometer 9. The direction and length of the arrow at point C indicates the direction and magnitude of the acceleration at the point at which the Y-stage position measuring laser interferometer 9 is mounted on the telescopic surface plate 3. According to FIG. 2, the accelerations at points A, B and C when the base surface plate 2 and telescopic surface plate 3 move translationally are equal in magnitude and direction, whereby acceleration of the surface plate vibration due to the reactive force created when the Y-stage 5 is step-driven can be measured at any points of A, B and C. In this embodiment, the Y-direction surface plate accelerometer 10 is disposed in the vicinity of point B.

Figure 3:
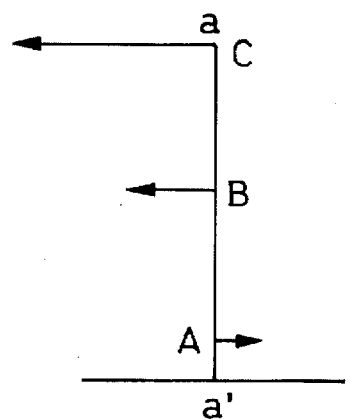
FIG. 3 illustrates a schematic view of an example of surface plate acceleration in the Y direction of each part on the line a—a' when movements of surface plates of FIG. 1 have a translation component and a pitching component simultaneously.

FIG. 3 illustrates an example of the magnitude and direction of the acceleration at different parts of the line a—a' when the Y-stage 5 is step-driven, whereby movement of the base surface plate 2 and the telescopic surface plate 3 in the step-drive direction of the Y-stage 5 have a translation component and a rotational component simultaneously. Referring to FIG. 3, the directions and magnitudes of the arrows at points A, B and C take on the same meanings as those of points A, B and C of FIG. 2.

If the direction of acceleration of the vibrations of the surface plates at point A due to the reactive force created when the Y-stage 5 is step-driven is different from that at point B, and the Y-direction surface plate accelerometer 10 is disposed on the base surface plate 2, not only the magnitude of the acceleration but also the direction of acceleration of the vibrations of the surface plates can not be exactly detected. As a result, not only is the effect of feedback of the surface plate acceleration eliminated but also the accuracy with which the stages can be positioned is adversely affected.

In this embodiment, the Y-direction surface plate accelerometer 10 is disposed in the vicinity of point B. By this arrangement, the acceleration signal of the base surface plate 2 in the Y direction output from the Y-direction surface plate accelerometer 10 is always in phase with the signal representing the position information output from the Y-stage position measuring laser interferometer 9 (the signal being indicative of the position of the Y-stage 5 and the position of the telescopic surface plate 3 with respect to the Y-stage 5 when the telescopic surface plate 3 is vibrating), and the magnitude of the surface plate acceleration can be detected almost exactly even if movements of the base surface plate 2 and the telescopic surface plate 3 have a translation component and a rotational component simultaneously. Therefore, the Y-stage 5 can always follow the vibrations of the base surface plate 2 and telescopic surface plate 3 to eliminate the positional shift, thereby improving positioning control properties of the apparatus.

Figure 4:
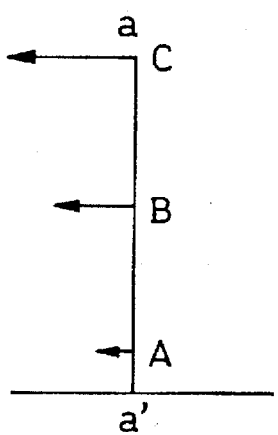
FIG. 4 illustrates a schematic view of another example of surface plate acceleration in the Y direction of each part on the line a—a' when movements of surface plates of FIG. 1 have a translation component and a pitching component simultaneously.

FIG. 4 illustrates another example of the magnitude and direction of the acceleration at different parts of the line a—a' when the Y-stage 5 is step-driven, whereby movements of the base surface plate 2 and the telescopic surface plate 3 in the step-drive direction of the Y-stage 5 have a translation component and a pitching component simultaneously. Referring to FIG. 4, the directions and magnitudes of the arrows at points A, B and C take on the same meanings as those of the points A, B and C of FIG. 3.

The direction of acceleration at point A of the surface plate vibration due to the reactive force when the Y-stage 5 is step-driven is equal to that at point B, but is slightly different in magnitude. If the Y-direction surface accelerometer 10 is directly disposed on the base surface plate 2, the magnitude of the acceleration of the surface plate vibration created when the Y-stage 5 is step-driven can not be exactly detected. Thus, the advantageous effect of feedback of the surface plate acceleration is reduced.

In this embodiment, the Y-direction surface plate accelerometer 10 is disposed in the vicinity of point B. By this arrangement, the acceleration signal of the base surface plate 2 in the Y direction output from the Y-direction surface plate accelerometer 10 is always in phase with the signal representing position information output from the Y-stage position measuring laser interferometer 9, and the magnitude of the surface plate acceleration can be detected almost exactly even if movements of the base surface plate 2 and the telescopic surface plate 3 have a translation component and a rotational component simultaneously. Therefore, the Y-stage 5 can always follow the vibrations of the base surface plate 2 and telescopic surface plate 3 to eliminate the positional shift, thereby improving positioning control properties of the apparatus.

Figure 5:
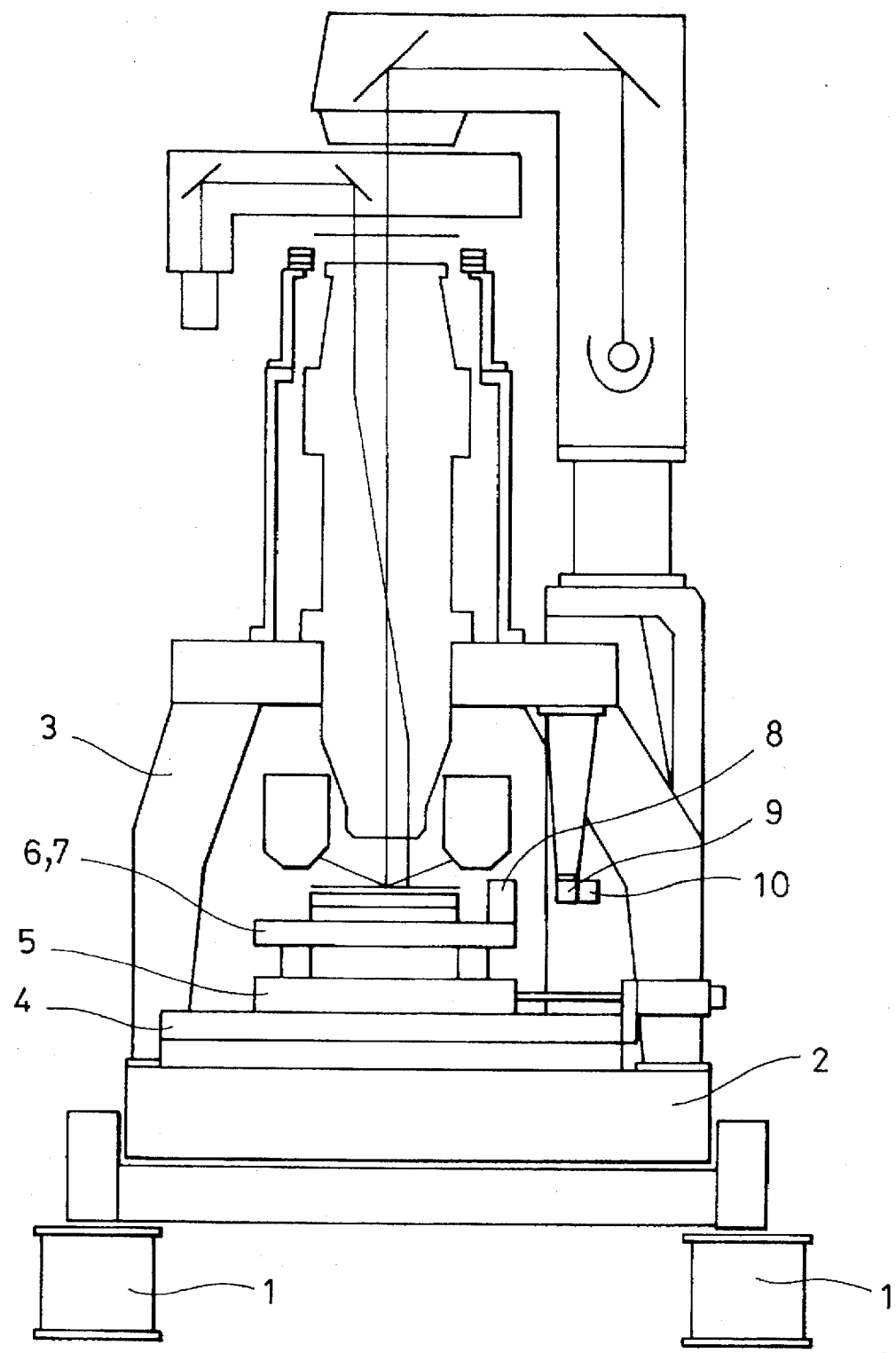
FIG. 5 illustrates a schematic view of an exposure system to which a positioning apparatus according to another embodiment of the present invention is applied.

FIG. 5 illustrates another embodiment of the present invention. In FIG. 5, the same components as those of FIG. 1 are indicated by the same references.

The above-described configuration is different from the conventional one in the following ways. Conventionally, the Y-direction surface plate accelerometer 10 is disposed on the base surface plate 2 directly. In this embodiment, however, the Y-direction surface plate accelerometer 10 is disposed integrally on the rear of the Y-stage position measuring laser interferometer 9, and more specifically, at the rear of the portion of the interferometer 9 emitting a laser beam. This has the same effect as that of the embodiment of FIG. 1, and the acceleration signal of the base surface plate 2 in the Y direction output from the Y-direction surface plate accelerometer 10 and the signal representing position information measured by the Y-stage position measuring laser interferometer 9 are always in phase, and the magnitude of the surface plate acceleration can be detected almost exactly even if movements of the base surface plate 2 and the telescopic surface plate 3 have a translation component and a rotational component simultaneously. Therefore, the Y-stage 5 can always follow the vibrations of the base surface plate 2 and telescopic surface plate 3 to eliminate the positional shift, thereby improving positioning control properties of the apparatus.

What is claimed is:

1. A positioning apparatus, comprising:
   a stationary portion;
   a movable portion movably mounted on said stationary portion, wherein acceleration of said movable portion causes vibration of said stationary portion;
   position measurement means, fixed to said stationary portion, for measuring the position of said movable portion and producing a position signal representative therefor and indicative of the position of said stationary portion with respect to said movable portion when said stationary portion is vibrating;
   acceleration measurement means, fixed to said stationary portion, for measuring the acceleration of said stationary portion and producing an acceleration signal representative thereof; and
   positioning control means for feeding back the position signal and the acceleration signal to said movable portion to move and position said movable portion to a predetermined target position,
   wherein said position measurement means and said acceleration measurement means are positioned on said stationary portion such that the position signal is in phase with the acceleration signal.

2. A positioning apparatus according to claim 1, wherein said movable portion has two movable parts which are movable in directions at right angles to each other, and wherein said position measurement means and said positioning control means perform measuring and positioning of each movable part separately.

3. A positioning apparatus according to claim 1, wherein said position measurement means includes a laser interferometer, and wherein said acceleration measurement means is disposed on a flat surface parallel to a moving direction of said movable portion.

4. A positioning apparatus according to claims 1 or 2, wherein said position measurement means includes a laser interferometer, and wherein said acceleration measurement means is mounted on a portion of said laser interferometer emitting a laser beam.

5. A positioning apparatus according to claims 1 or 2, wherein said position measurement means includes a laser interferometer, and wherein said acceleration measurement means is disposed at the rear of a portion of said laser interferometer emitting a laser beam.

6. A positioning apparatus, comprising:
   a stationary surface;
   a movable stage, disposed on said stationary surface, movable in at least one direction on said stationary surface, wherein acceleration of said movable stage vibrates said stationary surface;
   a stage position measuring device, disposed on said stationary surface, measuring the position of said movable stage and outputting a position signal representative thereof and of the vibration of said stationary surface occurring in response to the acceleration of said movable stage;
   an accelerometer, disposed on said stationary surface, measuring the acceleration of said stationary surface and outputting an acceleration signal representative thereof;
   a console setting a target position of said movable stage and outputting a target position signal representative thereof;
   means for driving said movable stage;
   a controller, attached to said console, said stage position measuring device, said accelerometer, and said driving means, said controller receiving the target position signal from said console, the position signal from said stage position measuring device, and the acceleration signal from said accelerometer, said controller outputting a driving signal to said driving means instructing said driving means to drive said movable stage to the set target position, and instructing said movable stage to move in the same manner as said stationary surface, in the event said stationary surface vibrates in response to acceleration of said movable stage, in accordance with the position signal and the acceleration signal,
   wherein said stage position measuring device and said accelerometer are positioned such that the position signal is in phase with the acceleration signal in the event the vibration of said stationary surface has a translational component and a rotational component simultaneously.

7. The apparatus according to claim 6, wherein said stationary surface comprises:
   a mount;
   a base surface plate supported by said mount;
   a telescopic surface plate supported by said mount;
   a stage surface plate, disposed on said base surface plate, having a reference surface on the upper surface thereof,
   wherein said movable stage is disposed on said reference surface,
   wherein said stage position measuring device is disposed on said telescopic surface plate, and
   wherein said accelerometer is disposed on said base surface plate.

8. The apparatus according to claim 7, further comprising a column on said base surface plate, on which said accelerometer is positioned, wherein the height of the column is such that said accelerometer and said stage position measuring device are at substantially the same height above said base surface plate.

9. The apparatus according to claim 7, wherein said movable stage is a Y-stage movable in the Y axis direction, said apparatus further comprising: an X-stage movable in the X axis direction, disposed on said Y-stage; an X-stage position measuring device disposed on said telescopic surface plate; an X-stage accelerometer disposed on said base surface plate; means for driving said X-stage; and an X-stage controller, connected to said X-stage position measuring device, said X-stage accelerometer, and said driving means, for controlling the movement of said X-stage through said driving means, wherein said X-stage position measuring device and said X-stage accelerometer are positioned such that a position signal produced by said X-stage position measuring device and an acceleration signal produced by said X-stage accelerometer are in phase with each other in the event the vibration of said base surface plate has a translational component and a rotational component simultaneously.

10. The apparatus according to claim 6, wherein said accelerometer and said stage position measuring device are positioned at substantially the same height above said stationary surface.

11. The apparatus according to claim 6, further comprising a column on said stationary surface on which said accelerometer is supported.

12. The apparatus according to claim 6, wherein said accelerometer is mounted on said stage position measuring device.

13. The apparatus according to claim 6, wherein said stage position measuring device is a laser interferometer.

14. The apparatus according to claim 6, wherein said drive means comprises means for step driving said movable stage in a step-by-step manner.

* * * * *

UNITED STATES PATENT AND TRADEMARK OFFICE
CERTIFICATE OF CORRECTION

PATENT NO. : 5,686,991
DATED : November 11, 1997
INVENTOR(S) : Toshiaki YAMAZAKI It is certified that error appears in the above-identified patent and that said Letters Patent is hereby corrected as shown below:

On the title page:

Item [54] Title of the Invention:

"THERE" should read --THEIR--.

Column 1:

Line 4, "THERE" should read --THEIR--.

Column 3:

Line 47, "objections" should read --objects--.

Signed and Sealed this

Twenty-eighth Day of July, 1998

Attest:

BRUCE LEHMAN

Attesting Officer

Commissioner of Patents and Trademarks